United States Patent
Hagenbeck et al.

(10) Patent No.: US 7,408,222 B2
(45) Date of Patent: Aug. 5, 2008

(54) CHARGE TRAPPING DEVICE AND METHOD OF PRODUCING THE CHARGE TRAPPING DEVICE

(75) Inventors: Rainer Hagenbeck, Putzbrunn (DE); Christoph Ludwig, Langebrueck (DE); Mark Isler, Dresden (DE); Elard Stein von Kamienski, Dresden (DE)

(73) Assignee: Infineon Technologies AG, Munich (DE)

( * ) Notice: Subject to any disclaimer, the term of this patent is extended or adjusted under 35 U.S.C. 154(b) by 52 days.

(21) Appl. No.: 11/390,997

(22) Filed: Mar. 27, 2006

(65) Prior Publication Data

US 2007/0221988 A1    Sep. 27, 2007

(51) Int. Cl.
*H01L 29/76* (2006.01)
*H01L 21/331* (2006.01)

(52) U.S. Cl. ............ 257/327; 257/335; 438/301; 438/306

(58) Field of Classification Search ............ 438/514, 438/300, 301, 303, 305, 306, 307, 527; 257/385, 257/327, 328, 335, 336, 344, 408; 365/185.14
See application file for complete search history.

(56) References Cited

U.S. PATENT DOCUMENTS

| 5,155,369 | A | 10/1992 | Current |
| 5,374,836 | A | 12/1994 | Vinal et al. |
| 5,912,843 | A * | 6/1999 | Jeng .................. 365/185.14 |
| 6,417,081 | B1 | 7/2002 | Thurgate |
| 6,559,016 | B2 * | 5/2003 | Tseng et al. ............. 438/302 |
| 6,570,233 | B2 * | 5/2003 | Matsumura ............. 257/385 |
| 6,686,242 | B2 | 2/2004 | Willer et al. |
| 2004/0102026 | A1 | 5/2004 | Wong et al. |
| 2005/0062102 | A1 * | 3/2005 | Dudek et al. ............ 257/335 |
| 2005/0098817 | A1 | 5/2005 | Hsu et al. |

* cited by examiner

*Primary Examiner*—Kevin M Picardat
(74) *Attorney, Agent, or Firm*—Slater & Matsil, L.L.P.

(57) ABSTRACT

A charge-trapping device includes a field effect transistor, which has source and drain regions. The source and drain regions have a dopant concentration profile, which has a gradient each in a vertical and a lateral direction with respect to a surface of a semiconductor substrate. The gradient in the lateral direction towards a depletion region of the transistor is larger than the gradient in the vertical direction towards a well region.

49 Claims, 7 Drawing Sheets

CHARGE TRAPPING DEVICE AND METHOD OF PRODUCING THE CHARGE TRAPPING DEVICE

TECHNICAL FIELD

The invention relates to a charge-trapping device, and more specifically to a charge-trapping device used in semiconductor flash memory. The invention further relates to field of implantation in order to form field effect transistors.

BACKGROUND

Memory cells of a flash memory array are based on trapping of charge carriers in a floating gate or in a dielectric memory layer confined by thin confinement layers, e.g., an ONO-layer sequence. These non-volatile memory cells are electrically programmable and erasable.

One cell concept has been developed to allow for the storage of two bits per cell. Therein, a wordline crossing an active substrate and provided with an ONO-layer sequence is designed to charge-trap channel hot electrons (CHE) in confined regions of the ONO-layer sequence on both sides of a channel or depletion region in the substrate. In other words the charge carriers are trapped in a location of the ONO-layer sequence sandwiched between the word line (or gate electrode) and the active substrate, where separated source and drain regions, the depletion region and the gate electrode approach each other.

Charge carriers moving from source to drain through the channel or depletion region are accelerated and gain enough energy in order to penetrate through the lower confinement layer of the ONO-layer sequence. These charge carriers are then trapped within the memory layer. As a result, the trapped charge carriers influence the threshold voltage of the cell transistor structure. Different programming states can then be read by applying the appropriate reading voltages.

In consequence, programming and reading occurs by means of applying different voltages to each two bitlines connecting opposite source and drain regions of a transistor. Which of the two locations per cell is read out with respect to the stored charge carriers depends on the current direction according to the voltage drop between the two bitlines.

In one embodiment of a semiconductor flash memory, memory cells are arranged within an array 2 at cross-points of word lines 14 with bit lines 10, 12 as shown in FIG. 1. Each memory cell has a transistor 16 with source and drain regions 11, 13 (see FIG. 2). Reference numeral 10 in this embodiment refers to bit lines connecting source regions 11, and numeral 12 denotes bit lines connected with drain regions. In the architecture of this embodiment, e.g., erase operations are performed collectively and simultaneously with respect to multiple memory cells arranged in a so-called e-sector (erase sector) 19 or 21, wherein an e-sector is defined by control units 18, 20 associated with a dedicated set of word lines. An e-sector is the smallest possible segment of an array to perform the task of erasing bits.

When erasing bit information stored in the memory cells, a considerable voltage of, e.g., −7 V is applied to all the word lines 14 of an e-sector (e-sector 21 in FIG. 1). At the same time a large voltage of, e.g., +6 V is applied to the bit lines 10 and 12 in order to generate hot holes, which compensate for the electrons stored in the memory layer when being injected therein.

One problem that may arise due to such architectures is that memory cells associated with word lines 14 of a neighboring e-sector 19 undergo the same voltage difference with respect to source and drain as those cells located within the currently active e-sector 21, because these are connected with the same bit lines 10 or 12.

FIG. 2 shows a cross section of two field effect transistors 16 of respective two-bit memory cells, which neighbor each other. The memory cells are accessed via respective word lines 14a, 14b, which form the outermost word lines of a corresponding e-section 19, 21. Word line 14b (gate electrode) of the memory cell within the e-sector 21 is provided with a voltage of −7 V and drain bit line 12 is provided with a voltage of +6 V.

As a result, an electron-hole pair is generated (band-to-band tunneling). The electron moves towards the large drain potential. The hole gains energy and drifts towards the negative gate electrode potential and is eventually injected into the ONO-layer in order to erase the bit content stored therein as it is desired.

However, due to the large an amount of holes thus generated some holes may also be accelerated vertically down towards the substrate (well). Secondary electrons may be generated thereby means of impact ionization. These secondary electrons are attracted by gate electrode (word line 14a) currently supplied with a voltage of +4 V and not being intended to be erased. If the secondary electrons equally gain sufficient energy, they may even enter the memory layer and thus program a hitherto non-programmed memory cell (bits #1 or #2 of the neighboring memory cell) despite the extraordinarily large voltage of +6 V supplied to the drain region 13 located between the gate electrodes. Note, a voltage of +3 V or +4 V (instead of, e.g., zero voltage) may be applied to word lines 14 of neighboring e-sectors in order to inhibit unintended erasure of programmed bits (inhibit voltage).

Further, as shown in FIG. 2, an electron-hole pair may also be generated by impact ionization at the pn-junction at the bottom of drain region 13, which is connected to bit line 12, due a generally strong gradient of free charge carrier concentration. The same effect of unintended programming of unprogrammed bits due to hot electrons may happen as described above.

Moreover, in excess of what happens with respect to neighboring word lines of different e-sectors as described above, the electron-hole pair generation at the bottom pn-junction of the drain region may affect each word line of a neighboring (inhibited) e-sector. The effect of undesired programming of bits during an erase is known as a bit line disturb.

As is further shown in FIG. 2, source regions 11 connected to non-selected bit lines 10 may be supplied with a voltage of 4 V, which is accomplished by means of so-called shunt transistors. The goal is to reduce unintended programming of erased bits due to the injection of channel hot electrons.

Hence, there is a need to improve a semiconductor flash memory particularly with regard to the performance characteristics during erase operations. Further, the lifetime (number of write and erase cycles) of a semiconductor flash memory product should be increased.

SUMMARY OF THE INVENTION

In accordance with one aspect of the invention there is provided a charge-trapping device comprising a field effect transistor formed on a semiconductor substrate. The transistor includes a gate dielectric layer formed on a surface portion of the semiconductor substrate, and a gate conductor, which forms or is connected to a word line and which contacts the gate dielectric layer. A source and a drain region are provided, which are formed within the semiconductor substrate adjacent to the surface portion covered by the gate dielectric layer, wherein the source and drain region each comprise at least one implant region. The at least one implant region has a first concentration profile of dopants in a vertical direction with respect to a substrate surface and a second concentration profile of dopants in a lateral direction with respect to the substrate surface. The second concentration profile in the lateral direction has a gradient, which is larger than a gradient of the first concentration profile in the vertical direction.

In accordance with another aspect of the invention there is provided a charge-trapping device comprising a field effect transistor formed on a semiconductor substrate. The device includes a gate dielectric layer formed on a surface portion of the semiconductor substrate, and a gate electrode, which forms or is connected to a word line and which contacts the gate dielectric layer. A source and a drain region are provided, which are formed within the semiconductor substrate adjacent to the surface portion covered by the gate dielectric layer, wherein the source and drain region each comprise at least two implant regions overlapping each other. A concentration of dopants and a lateral dimension of a highly doped one of the overlapping implant regions are larger than that of a lightly doped one of the implant regions. A vertical dimension of the highly doped implant regions is smaller than that of the lightly doped implant region, such that a pn-junction with a strong gradient of dopant concentration extends laterally towards a depletion region of the transistor and a pn-junction with a weak gradient of dopant concentration extends vertically towards a well region.

In accordance with another aspect there is provided a method of producing a charge-trapping device. The method includes providing a semiconductor substrate having a surface portion covered by a gate dielectric layer for trapping charges and a stack including a gate electrode formed on the gate dielectric layer. An implant step with dopants with respect to the semiconductor substrate adjacent to the surface portion covered by the gate dielectric layer is performed, to form source and drain regions, which each include an implant region that has a dopant concentration profile, such that a pn-junction with a strong gradient of dopant concentration extends laterally towards a depletion region of the transistor and a pn-junction with a weak gradient of dopant concentration extends vertically towards a well region.

In accordance with another aspect of the invention, there is provided a method of producing a charge-trapping device. The method includes providing a semiconductor substrate having a surface portion covered by a gate dielectric layer for trapping charges and a stack including a gate electrode formed on the gate dielectric layer. A first implant step with dopants with respect to the semiconductor substrate adjacent to the surface portion covered by the gate dielectric layer is performed, to form source and drain regions, which include a highly doped implant region that has a dopant concentration, a lateral and a vertical dimension. Additional spacers are formed at sidewalls of the stack including the electrode in order to cover a surface portion of highly doped implant region. Thereafter, a second implant step with dopants with respect to the semiconductor substrate adjacent to the surface portion covered by the additional spacers is performed, to form source and drain regions, which further include a lightly doped implant region, which has a dopant concentration and a lateral dimension smaller than that of the highly doped implant region, a vertical dimension larger than that of the highly doped implant region, such that a pn-junction with a strong gradient of free charge carrier concentration extends laterally towards a channel region and a pn-junction with a weak gradient of free charge carrier concentration extends vertically towards a well region.

In accordance with a still further aspect of the invention, there is provided a method of producing a charge-trapping device. The method includes providing a semiconductor substrate having a surface portion covered by a gate dielectric layer for trapping charges and a stack including a gate electrode formed on the gate dielectric layer. A first implant step with dopants with respect to the semiconductor substrate adjacent to the surface portion covered by the gate dielectric layer is performed, to form source and drain regions, which include a highly doped implant region that has a dopant concentration, a lateral and a vertical dimension. A thermal diffusion process is applied to increase the lateral dimension of the highly doped implant region. Thereafter, a second implant step with dopants with respect to the semiconductor substrate adjacent to the surface portion covered by the additional spacers is performed, to form source and drain regions, which further include a lightly doped implant region, which has a dopant concentration and a lateral dimension smaller than that of the highly doped implant region, a vertical dimension larger than that of the highly doped implant region, such that a pn-junction with a strong gradient of dopant concentration extends laterally towards a depletion region of the transistor and a pn-junction with a weak gradient of dopant concentration extends vertically towards a well region.

Instead of applying a thermal diffusion process to increase the lateral dimension of the highly doped implant region another technological solution is to apply a certain angle to this first implant according to this aspect.

A charge-trapping device comprises a field effect transistor, which has source and drain regions. The source and drain regions comprise a dopant concentration profile, which has a gradient each in a vertical and a lateral direction with respect to a surface of a semiconductor substrate. The gradient in the lateral direction towards a depletion region of the transistor is larger than the gradient in the vertical direction towards a well region.

The dopant concentration profile may result from one or more implant regions overlapping each other, the implant region(s) being formed of the same or different conductivity type and further being formed during distinct steps of implant.

In one aspect, the difference between lateral and vertical concentration gradients may be achieved by already one implant step by a channeling tail of the profile, which smoothes out the vertical profile. In contrast, the lateral profile is not affected by channeling.

According to aspects of the invention, source and drain regions of a transistor region are formed by establishing at least two implant regions, which overlap each other but have different dimensions in the lateral as well as in the vertical direction. Moreover, the dopant concentration between both overlapping implant regions differs.

There is provided a highly doped implant region and a lightly doped implant region. As may be inferred from the naming of the regions, the highly doped implant region has a higher concentration of dopants than the lightly doped implant region. Furthermore, the highly doped implant region extends further in the lateral direction, i.e., parallel to the surface of the semiconductor substrate, while the lightly doped implant region has a larger depth.

Both implant regions represent dopant concentration profiles as results of different implant steps performed on the semiconductor substrate. The concentration and the depth may also be expressed as parameters: maximum concentration and slope of the corresponding profile, which typically decreases with depth in an exponential form.

From the foregoing it becomes clear that the highly doped implant region has a large maximum concentration at the semiconductor surface and a steep slope due to its comparatively smaller depth. Further, the lightly doped implant region has a smaller maximum concentration and a flatter slope than that of the highly doped implant region. Accordingly, near the surface of the semiconductor substrate, the highly doped implant region dominates the combined dopant concentration profile, while with increasing depth the contribution of the lightly doped implant region becomes important due to the flat profile.

As a result, when both implant regions are of the same conductivity type, the resulting source or drain region has a weaker slope in vertical concentration profile near the pn-junction than would be the case with just one highly doped implant region. Consequently, the development of strong electrical fields during erase processes and thus the disadvantageous generation of the electron-hole pairs in the bottom zone of a source or drain region is considerably reduced.

Further, according to one embodiment, the lateral extent of the highly doped implant region is increased with respect to the lightly doped implant region. This feature serves to retain the strong dopant concentration gradients towards the channel or depletion regions of transistors, which are necessary in order to generate the electron-hole pairs (band-to-band tunneling) at the corresponding pn-junction and to accomplish deliberate programming of bits. The lightly doped implant regions do not contribute to this portion of the pn-junction.

The larger depth and the smaller concentration of the lightly doped implant region may be accomplished by applying a larger dopant energy at a smaller dose when performing the respective implant as compared with the highly doped implant region. The smaller lateral dimension is accomplished by adding sidewall spacers to the gate stack between the implant steps, such that the exposed substrate area is less in the case of the lightly doped implant. According to another aspect, it is possible to perform both implant steps subsequently, i.e., even without additional spacers added in between, but applying a thermal step to the substrate instead, in order to drive diffusion of the dopants of the highly doped implant region more efficiently than those of the lightly doped implant region implanted thereafter. Diffusion also serves to provide an increase with respect to lateral extent.

The invention will become clearer with respect to certain embodiments when taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawing, in which:

FIG. 5: well implant, FIG. 6: source-drain implant, FIG. 7: pocket implant, FIG. 8: pocket compensation implant, FIG. 9 flat contact hole implant;

The following list of reference symbols can be used in conjunction with the FIGS.:

| | |
|---|---|
| 2 | array |
| 10, 12 | bit lines |
| 11, 13 | drain region |
| 13a | drain region (highly plus lightly doped) |
| 13b | highly doped implant region (cell source-drain implant) |
| 14 | word lines |
| 16 | transistor, charge-trapping device |
| 18, 20 | control register |
| 19, 21 | e-sector |
| 24, 26 | confinement layer |
| 25 | memory layer |
| 27 | surface portion of semiconductor substrate |
| 28 | pocket implant region |
| 28a | peak of pocket implant in depletion region |
| 28b | peak of pocket implant near bottom of drain region |
| 29 | surface portion of semiconductor substrate |
| 30, 30a | pn-junction |
| 32 | semiconductor substrate |
| 34-36 | spacers |
| 38 | contact hole |
| 50 | substrate surface |
| 52 | well region |
| 54 | lightly doped implant region (compensation implant) |
| 56 | contact hole surface implant region |
| 60 | scattering layer |
| 62 | lateral dopant concentration gradient |
| 64 | vertical dopant concentration gradient |
| 66 | depletion region of transistor |
| 102 | well implant |
| 104 | pocket zone implant |
| 106 | cell source-drain implant |
| 108 | pocket zone compensation implant |
| 110 | shallow contact hole surface implant |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
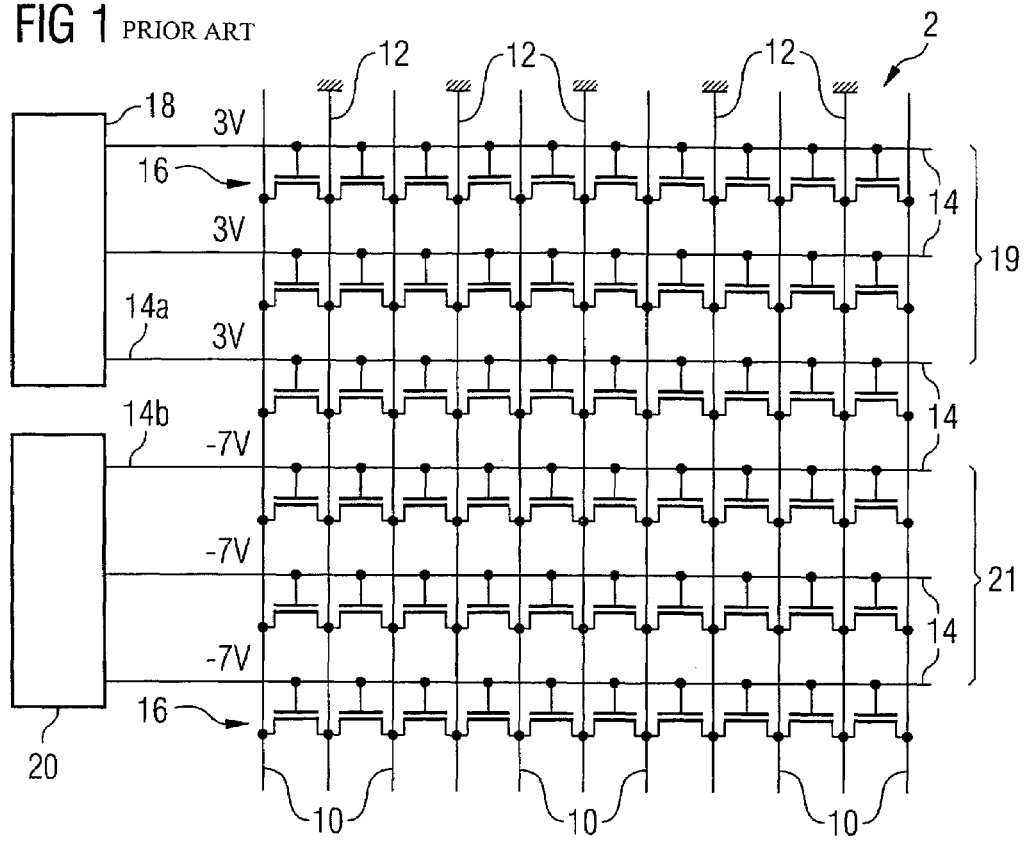
FIG. 1 shows a semiconductor flash memory array which has a segmentation of erase sectors.
Figure 2:
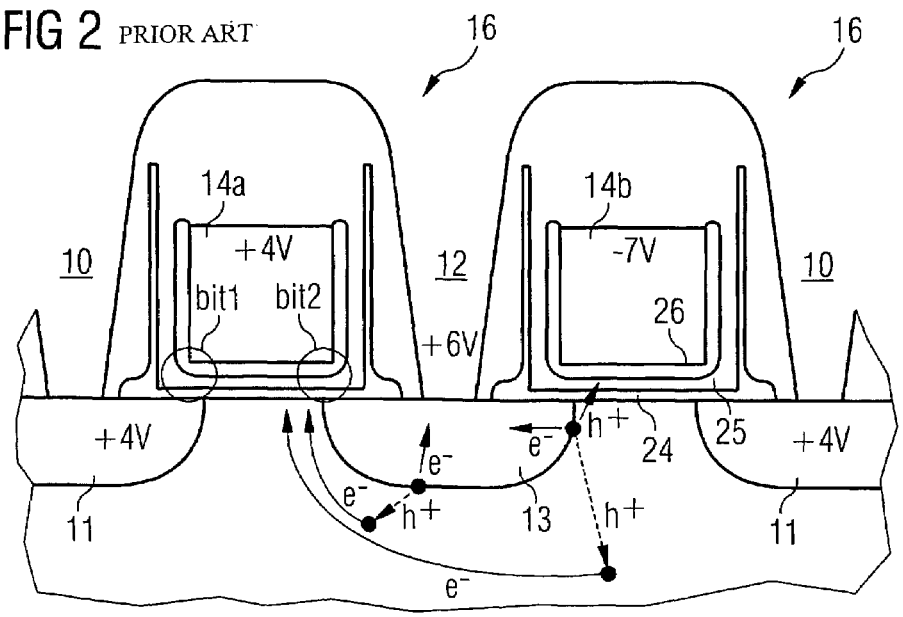
FIG. 2 shows a cross section of two transistors, or memory cells of the array shown in FIG. 1, wherein the memory cells belong to neighboring word lines which form edges of a respective e-sector.
Figure 3:
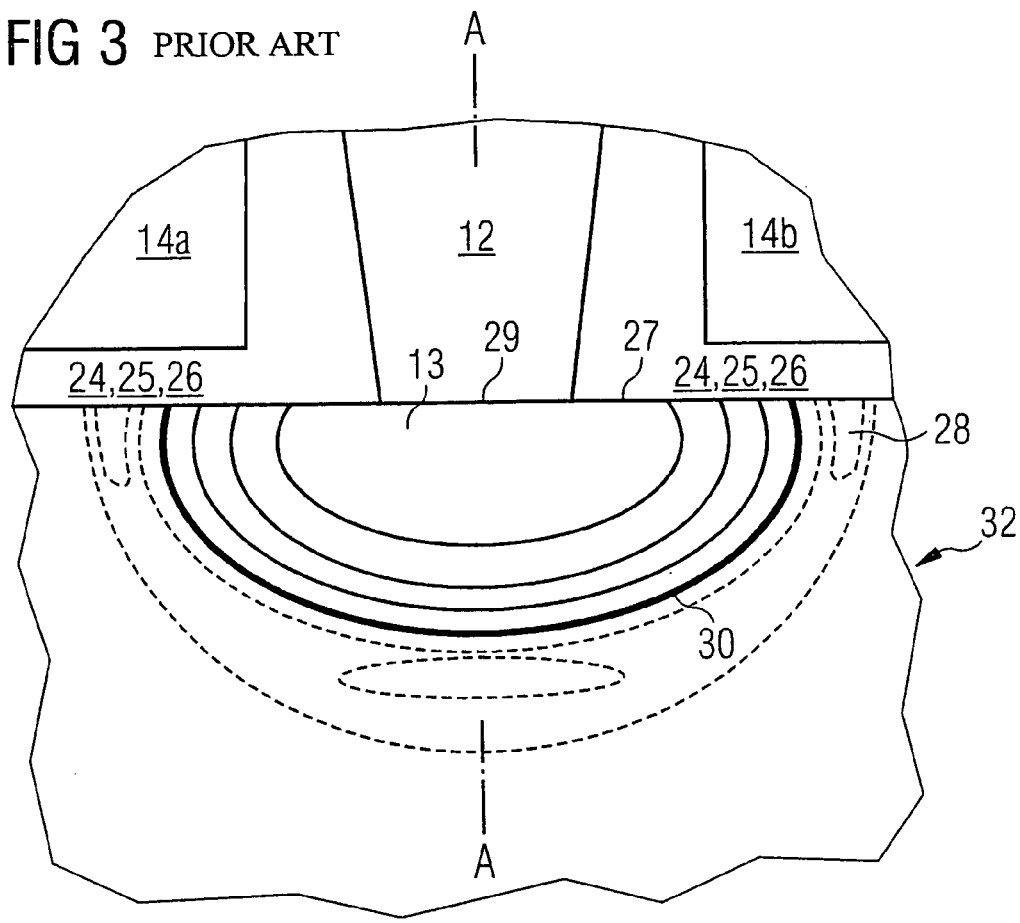
FIG. 3 shows a detailed cross section of a drain region of the two transistors shown in FIG. 2, wherein a dopant concentration profile of implant regions according to a prior art embodiment is indicated by contour lines.

FIG. 3 shows an embodiment of a drain region 13 with known dopant concentration profiles, indicated by contour lines, in a cross section of a transistor or memory cell which is a semiconductor flash charge-trapping device according to prior art. Gate stacks including an ONO-layer sequence 24-26 and gate electrodes, or word lines 14a, b, are formed on a surface portion 27 of a semiconductor substrate 32. A bit line 12 contacts another surface portion 29 of the substrate 32.

The drain implant region 13 is formed by implanting dopants of a dedicated conductivity type into the substrate 32, e.g., donators such as antimony (Sb), phosphorous (P) or arsenic (As). Accordingly, source and drain regions 11, 13 are n-conductive in this embodiment. The dopant concentration is largest, i.e., has a maximum value in a central portion of the drain region up to near of the surface portion 29 of the semiconductor substrate 32. The concentration decreases in a vertical direction into the substrate and in a lateral direction towards a channel or depletion region each associated with one of the transistor gate electrodes (surface region below gate dielectric layer 24-26 formed by the ONO-layer sequence).

A pocket implant region 28 is formed adjacent to the drain region 13 (or equivalently to the source region 11 not shown in FIG. 3). The pocket implant region 28 is formed by an implant with dopants of an opposite conductivity type, for example boron (p-conductive). One main purpose of the pocket implant region is to provide dopant concentration peaks within the channel region (two opposite peaks). The peaks of opposite conductivity type as compared with that of the source or drain regions lead to an improved separation of the two bits stored per memory cell on opposite sides of the ONO-layer and to a steeper dopant concentration profile at pn-junctions 30, which is advantageous when channel hot electrons are to be generated.

Figure 4:
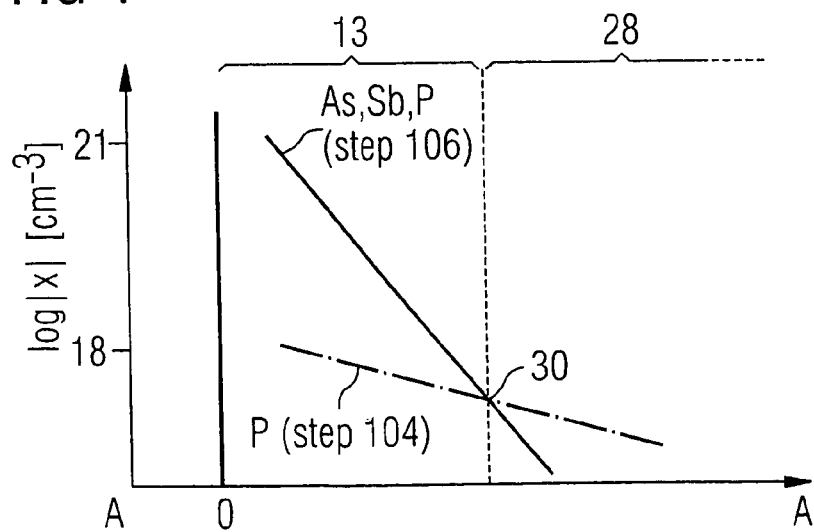
FIG. 4 shows a diagram of vertical dopant concentration profiles according to FIG. 3.

The respective vertical concentration profiles associated with the two implant regions 13, 28 are shown in FIG. 4. Plotted is the concentration (in $cm^{-3}$) versus depth in substrate along a line A-A shown in FIG. 3. The cell source-drain implant with As, Sb or P starts with a high concentration near the substrate surface, but has a steep slope. The pocket zone implant has a low maximum concentration but a weak slope. A pn-junction 30 is located where the pocket zone implant profile crosses the cell source-drain implant profile. As a result the pocket implant region is located deeper in the substrate as compared with the drain region 13, which may be due to larger dopant energy during pocket zone implantation.

It becomes clear that the steep net dopant concentration profile (net difference between concentrations due to different conductivity types) at the pn-junction also occurs in a vertical direction at the bottom portion of the drain region 13. This feature may lead to the bit line disturb as detailed above as holes of a pair may be accelerated in a vertical direction to create secondary electrons deeper in the substrate (well region).

With a continuous decrease in the size of memory cell design, this effect will become even worse as diffusion due to thermal processes will be kept small for thermal budget reasons. The concentration profile steepness is thus expected still to increase.

FIGS. 5-9 show a sequence of simplified cross sections associated with method steps of forming a charge-trapping device (memory cell including transistor) according to a first embodiment. Therein, the cross sections illustrate situations after having performed implant steps. More specifically, the detailed processes of depositing material layers, lithographically structuring these by means of coating a resist, exposure, development, etching etc. are not indicated in the FIG.s, and further shall not limit the scope of the invention with the exception of what is stated in the independent claims.

Figure 5:
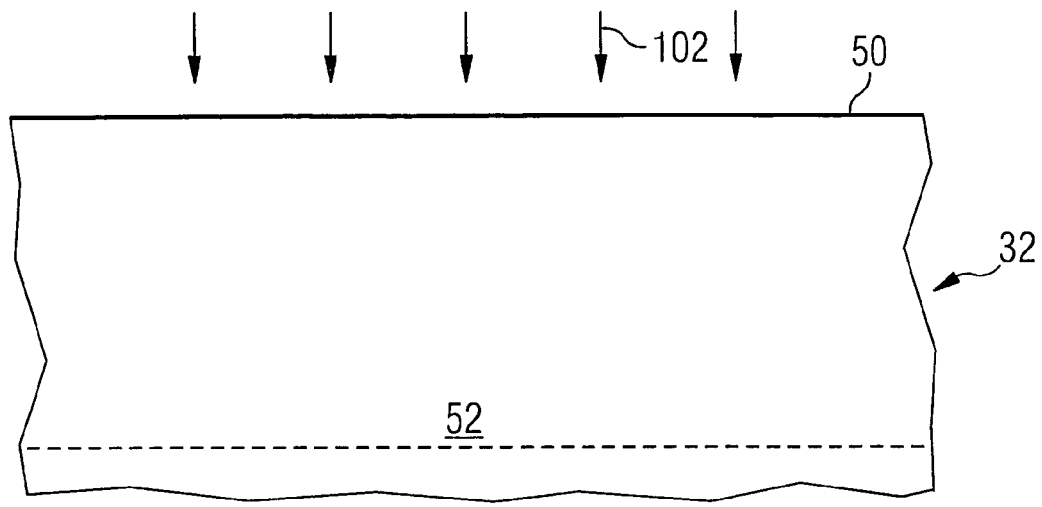
FIGS. 5-9 show a sequence of implant steps according to an embodiment of the method of forming a charge-trapping device in accordance with the invention.

FIG. 5 shows the situation after a well implant (step 102). Therein the semiconductor substrate 32 has an exposed surface 50 at least within locations relating to the memory cell array, which is formed in further processing. The well implant performed to yield well region 52 is carried out with large energy but small dose in order to yield sufficient depth. The dopants used to form well region 52 are of the second conductivity type in this embodiment (p-conductive).

Figure 6:
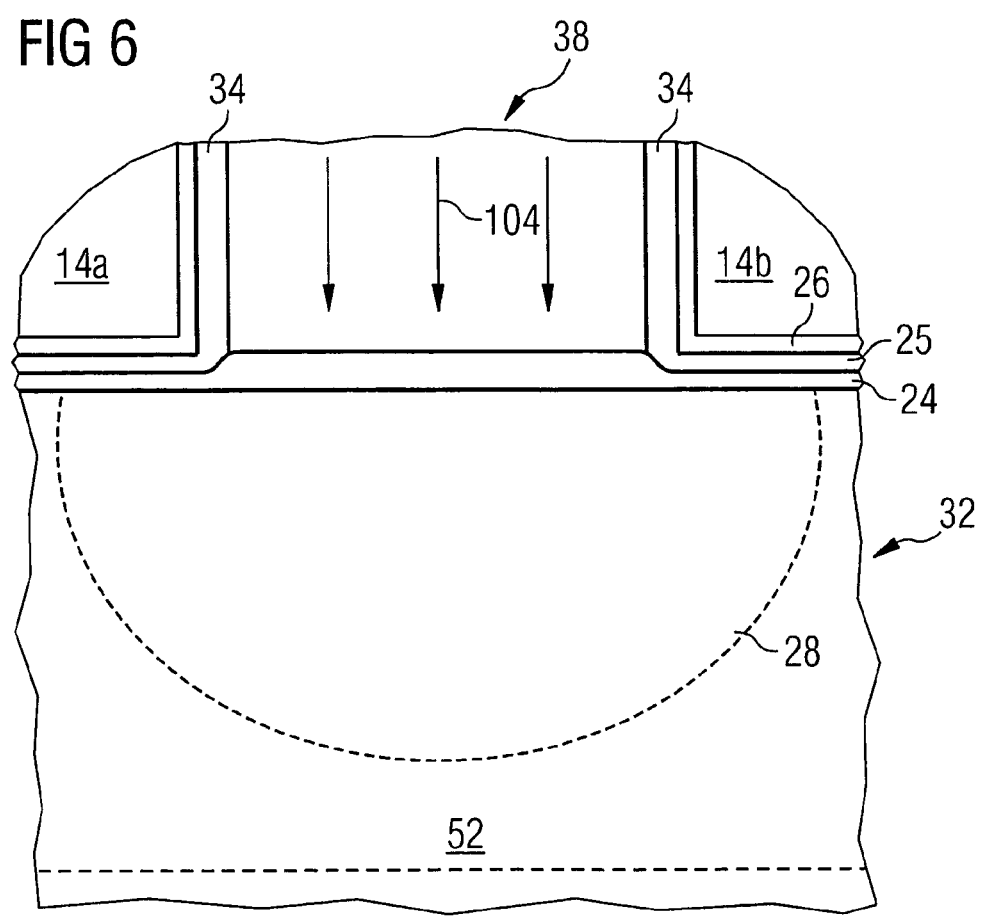

Next, as shown in FIG. 6, gate stacks including a gate dielectric layer and the gate electrode (word lines 14a, b) along with first sidewall spacers 34 are formed on a first surface portion 27 of the substrate 32. A second surface portion is left exposed to form a contact hole 38 for supplying a connection from a bit line 10, 12 to the drain region 13a due to be formed. The gate dielectric layer comprises a layer sequence of two confinement layers 24, 26 made of an oxide, which confine a memory layer 25 made of a nitride. Upon operation of the charge-trapping device, hot charge carriers are stored in the memory layer 25. The thickness realized in such ONO-layer sequences amount to a few nanometers and the specific conditions for optimum storage characteristics of the layer are well known in the art.

Through the contact hole 38 a further implant step 104 is carried out on the semiconductor substrate 32. This implant step leads to the formation of a pocket implant region 28. The dopants used are of the second conductivity type (p-conductive), e.g., boron.

Figure 7:
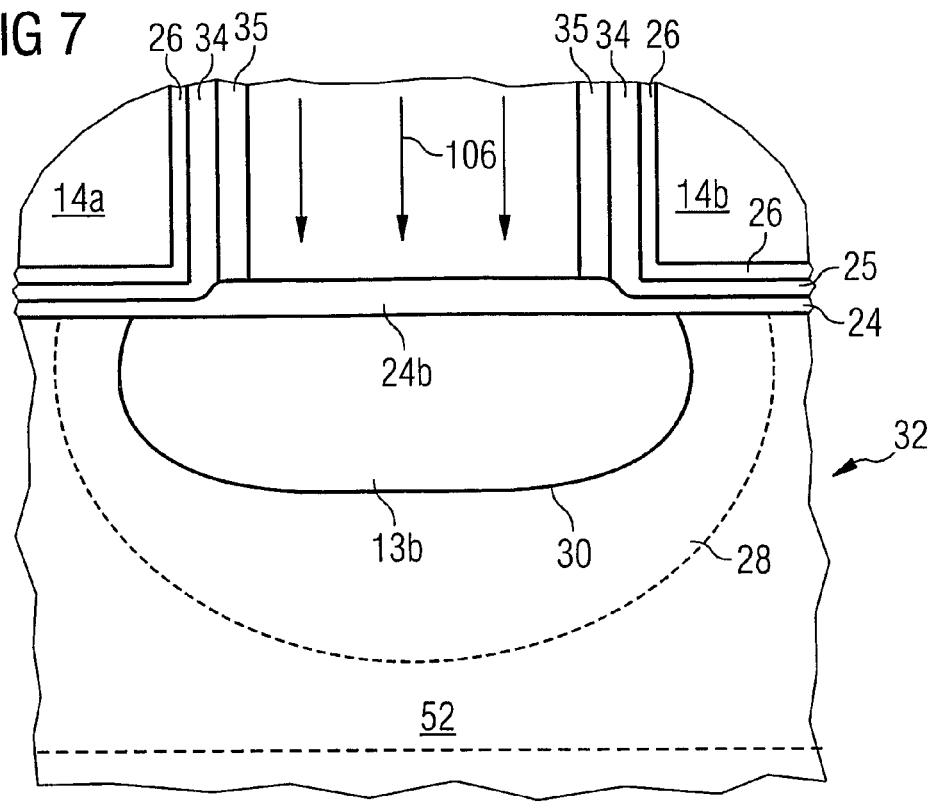

FIG. 7 shows the situation after a further sidewall spacer 35, e.g., of nitride has been deposited on the gate stack sidewall. A third implant step 106 is performed through the contact hole 38. This step 106 relates to a cell source-drain implant intended to form (source and) drain regions through a thin oxide 24b. The situation is now similar to that shown in FIG. 3. The dose applied by the implant is larger than that of the previous step 104 to yield a highly doped implant region 13b. It is noted that additional spacer 35 serves to recess the lateral extent of this cell source drain implant region 13b with respect to the pocket implant region 28 as it masks a portion of the semiconductor substrate surface. The dopants used are of the first conductivity type (n-conductive), e.g., As, Sb or P.

Figure 8:
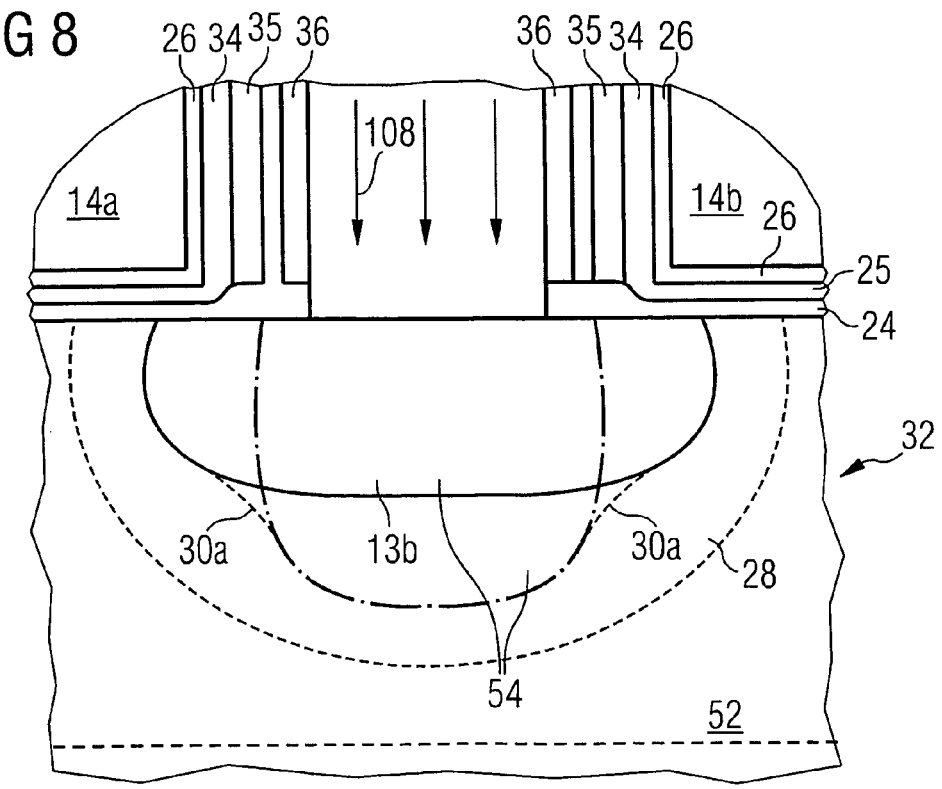

FIG. 8 shows an implant step 108 that is applied after an additional spacer 36 has been formed on the sidewall of the gate stack including the previously formed spacers 34, 35. As follows from the further reduced surface portion, this implant yields an implant region 54, which has a reduced lateral dimension as compared with implant region 13b. The dopants used are similar to the previous implant step 106 of the first conductivity type, that means n-conductive, e.g., As, Sb, or P. It is noted that the dopants used for steps 106, 108 need not be taken from the same element.

The thin oxide layer 24b has been removed for this implant step 108. Accordingly, scattering is reduced and the energy of the implanted dopants is retained in order reach larger depths in the substrate. However, the dose in implant step 108 applied is considerably smaller than in step 106, e.g., by order of one to three magnitudes, such that a lightly doped implant region 54 having a larger vertical dimension 62, a smaller lateral dimension 66 and a smaller maximum concentration develops, when compared with the highly doped implant region 13b (respective dimensions 60, 64, see FIG. 10).

As the dopants of implant region 54 overlap with those of implant region 13b, portions of pocket implant region 28 are compensated such that the pn-junction is driven to larger depths and the resulting drain region 13a increases in a vertical direction.

Figure 9:
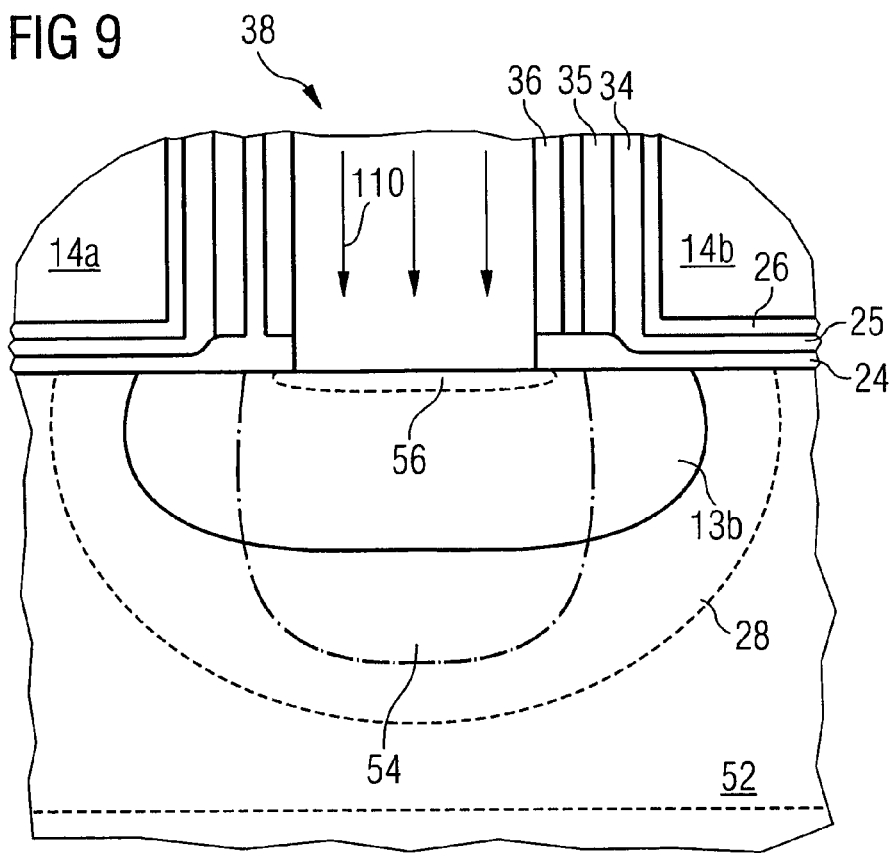

FIG. 9 shows a further implant step 110, which is a shallow or flat contact hole implant region 56, which is intended to yield a low ohmic contact with respect to the conductive filling to be supplied into the contact hole 38. The contact hole surface implant has a shallow depth and a large dopant concentration. The implant region 56 is n-conductive.

Figure 10:
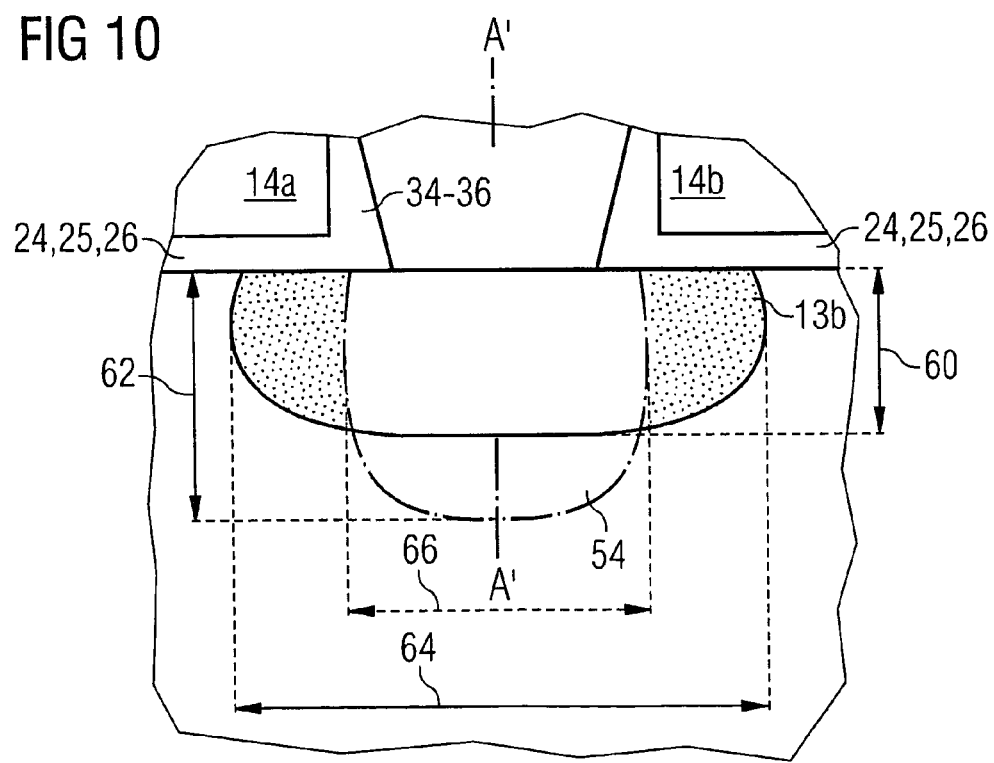
FIG. 10 shows in a schematic cross section the lateral and vertical dimensions of drain implant regions according to an embodiment of the charge-trapping device in accordance with the invention.

FIG. 10 shows as comparison of the highly doped and the lightly doped implant regions 13b, 54. It is noted that the lines bordering the regions do not represent limits of dopant locations. Rather, the lines indicate a length scale being characteristic for an exponentially decreasing profile, as becomes visible from inspection of FIG. 11. In this sense implant region 28 overlaps with both the highly doped and the lightly doped implant regions, but is compensated within drain region 13a, but dominates conductivity within the well region 52 beyond the pn-junction 30a.

Figure 11:
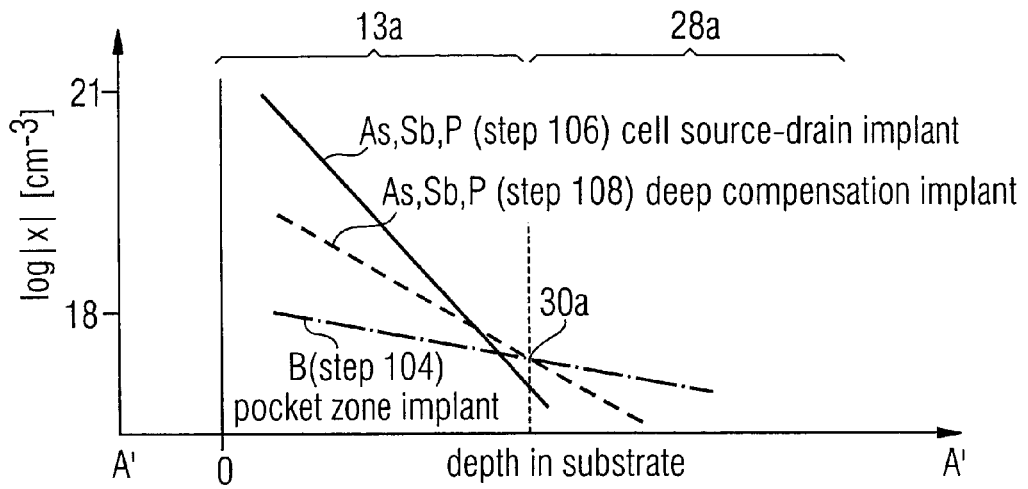
FIG. 11 shows a diagram of vertical dopant concentration profiles according to the embodiment shown in FIG. 10.

FIG. 11 shows a vertical dopant concentration profile of the implant regions 28, 13b and 54 along a vertical line A'-A' in FIG. 10. It becomes clearly visible that the profile relating to the lightly doped implant region dominates contribution to the conductivity near the location of the previous junction 30 (i.e., the junction without a presence of a lightly doped implant region). Accordingly, the gradient flattens, since it has a weaker slope in concentration profile. Further, the new pn-junction 30a is driven to larger depths as the drain region 13a is more heavily doped in its bottom part, as compared with the situation given in FIG. 4.

Figure 12:
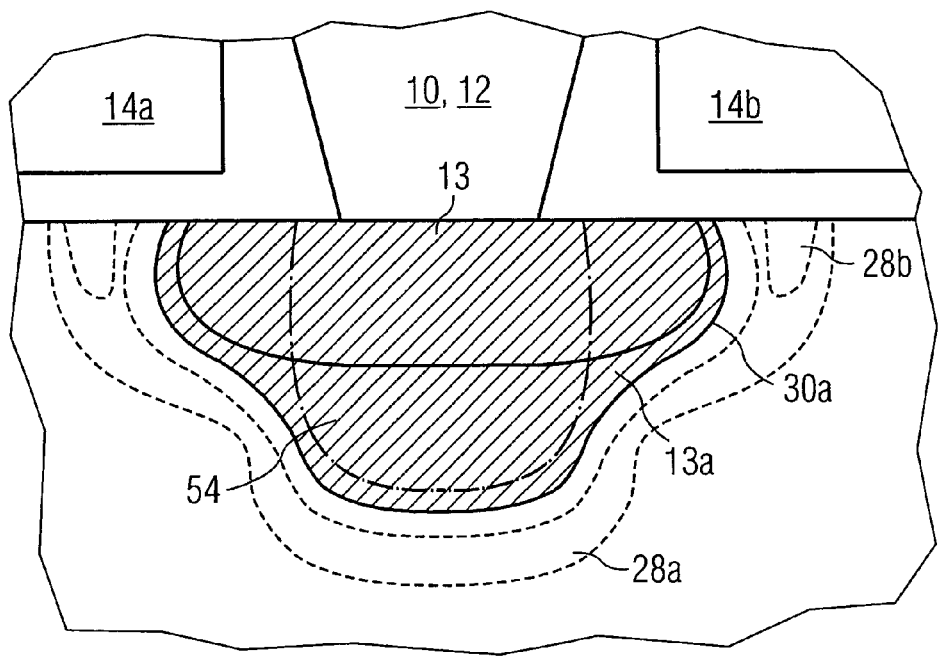
FIG. 12 shows a cross section of the drain and pocket implant regions according to an embodiment of the invention.

FIG. 12 shows the drain region 13a, resulting from an overlap of the implant regions 13b, 28, 54. It is noted that zones near the channel or depletion region (dotted in FIG. 10) are not affected by the compensation implant yielding lightly doped implant region 54. Thus peaks 28b of the pocket implant region near the channel region are advantageously retained, while a zone 28a of the pocket implant region near the bottom part of the drain region 13a is considerably reduced in size and peak values.

Figure 13:
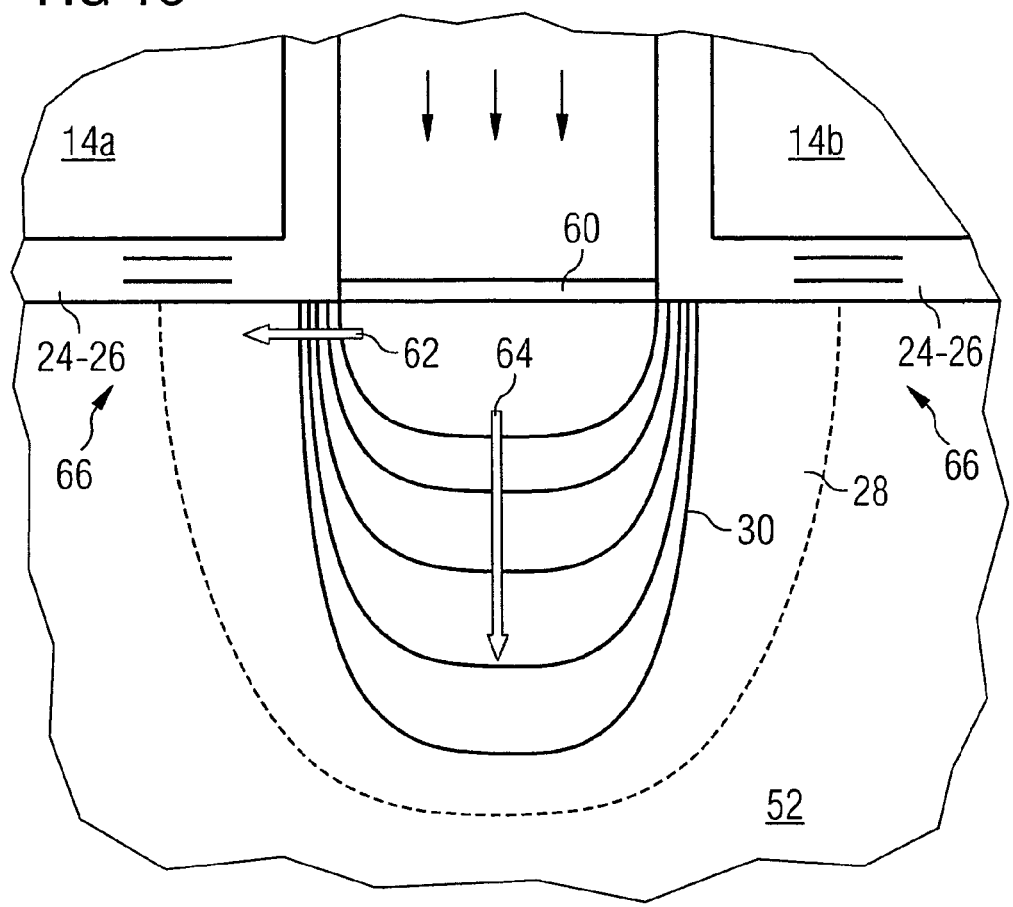
FIG. 13 shows a further embodiment illustrating different profile gradients of dopant concentration in a lateral and vertical direction, wherein one implant step is carried out utilizing channeling effects.

FIG. 13 shows another embodiment of the invention. Herein, one implant step is performed, which is capable of forming a strong gradient 62 in a lateral direction towards a depletion region 66 beneath the gate dielectric layer (stack of confinement and memory layers 24-26), while a weak gradient 64 is achieved in a vertical direction. In particular, gradient 64 is smaller than gradient 62. For this implant a thin scattering layer 60 is deposited on the substrate surface.

This kind of implant is carried out utilizing channeling effects along crystallographic preferred directions in the substrate. Dopants are thereby transferred deeper into the substrate. Therefore, the vertical concentration profile becomes much shallower, while the lateral concentration profile remains substantially unaffected. Thus, the generation of hot electrons at bottom portions of pn-junction 30 of the resulting source/drain regions is advantageously reduced.

It is noted that drain regions referred to in this invention may equivalently denote source region since their function may interchange depending on how the read, write or erase action is currently performed with respect to a memory cell.

It is further noted that the specific embodiments detailed herein shall not limit the scope of the invention and it is clear to persons skilled in the art that modifications of the charge-trapping device and the method of forming the device equivalently fall within this scope and shall be included in what is claimed herein.

What is claimed is:

1. A semiconductor device comprising a field effect transistor formed on a semiconductor substrate, the semiconductor device comprising:

a gate dielectric layer formed over a surface portion of the semiconductor substrate;

a gate conductor, in contact with the gate dielectric layer, the gate conductor forming or being electrically connected to a word line; and a source and a drain region formed within the semiconductor substrate adjacent to the surface portion covered by the gate dielectric layer, wherein the source and drain region each comprise at least one implant region;

wherein the at least one implant region has a first concentration profile of dopants in a vertical direction with respect to a substrate surface and a second concentration profile of dopants in a lateral direction with respect to the substrate surface; and wherein the second concentration profile in the lateral direction has a gradient, which is larger than a gradient of the first concentration profile in the vertical direction.

2. The semiconductor device according to claim 1, wherein the gate dielectric layer comprises a sequence of layers including a memory layer that is confined on both its top and bottom sides by at least one confinement layer.

3. The semiconductor device according to claim 2, wherein the memory layer comprises a nitride.

4. The semiconductor device according to claim 3, wherein the confinement layers each comprise an oxide.

5. The semiconductor device according to claim 3, wherein the memory layer is provided to store at least two bits of information independently from each other by means of trapping hot charge carriers generated at a selected pn-junction of the source or drain regions.

6. The semiconductor device according to claim 1, wherein the at least one implant region comprises dopants of a first conductivity type, the device further comprising a well region that comprises dopants of a second conductivity type, which is different from the first conductivity type.

7. The semiconductor device according to claim 6, wherein the first conductivity type is n-conductive, and the dopants of the at least one implant region comprise an element selected from the group consisting of Antimony (Sb), Phosphorous (P), and Arsenic (As), and combinations thereof.

8. The semiconductor device according to claim 1, wherein and the source drain regions each comprise at least two implant regions that overlap each other.

9. A semiconductor device comprising a field effect transistor formed on a semiconductor substrate, comprising:

a gate dielectric layer formed over a surface portion of the semiconductor substrate;

a gate conductor, in contact with the gate dielectric layer, the gate conductor forming or being electrically connected to a word line; and a source and a drain region formed within the semiconductor substrate adjacent to the surface portion covered by the gate dielectric layer;

wherein the source and drain region each comprise at least two implant regions overlapping each other;

wherein a concentration of dopants and a lateral dimension of a highly doped one of the overlapping implant regions is larger than that of a lightly doped one of the implant regions; and wherein a vertical dimension of the highly doped implant region is smaller than that of the lightly doped implant region, such that a pn-junction of the source or drain regions having a strong gradient of dopant concentration extends laterally towards a depletion region of the transistor and a respective pn-junction having a weak gradient of dopant concentration extends vertically towards a well region.

10. The semiconductor device according to claim 9, wherein the gate dielectric layer comprises a sequence of layers including a memory layer that is confined on its top and bottom side each by at least one confinement layer.

11. The semiconductor device according to claim 10, wherein the memory layer comprises a nitride.

12. The semiconductor device according to claim 11, wherein the confinement layers each comprise an oxide.

13. The semiconductor device according to claim 11, wherein the memory layer is provided to store at least two bits of information independently from each other by means of trapping hot charge carriers generated at a selected one of the pn-junctions of the source or drain regions.

14. The semiconductor device according to claim 9, wherein the at least two implant regions each comprise dopants of a first conductivity type, and the well region comprises dopants of a second conductivity type, which is different from the first conductivity type.

15. The semiconductor device according to claim 14, wherein the well region comprises a pocket implantation adjacent to a respective pn-junction of each of the source and drain regions, the pocket implantation zone comprising a concentration of dopants of the second conductivity type.

16. The semiconductor device according to claim 15, wherein the dopants of the pocket implantation zone comprise boron.

17. The semiconductor device according to claim 9, wherein the first conductivity type is n-conductive, and the dopants of the highly doped implant region and of the lightly doped implant region comprise the same element, which is selected from the group consisting of Antimony (Sb), Phosphorous (P), and Arsenic (As).

18. The semiconductor device according to claim 9, wherein the first conductivity type is n-conductive, and the dopants of the highly doped implant region and of the lightly doped implant region comprise different elements, the elements selected from the group consisting of Antimony (Sb), Phosphorous (P), and Arsenic (As).

19. A method of producing a semiconductor device, the method comprising:
providing a semiconductor substrate having a surface portion covered by a gate dielectric layer for trapping charges and a stack including a gate electrode formed on the gate dielectric layer; and
performing an implant step with dopants with respect to the semiconductor substrate adjacent to the surface portion covered by the gate dielectric layer, to form source and drain regions, which each include an implant region that has a dopant concentration profile, such that a pn-junction with a strong gradient of dopant concentration extends laterally towards a depletion region of the transistor and a pn-junction with a weak gradient of dopant concentration extends vertically towards a well region.

20. The method according to claim 19, wherein the implant step is performed by:
depositing a scattering layer on a surface of the semiconductor substrate; and
implanting the dopants into the substrate through the scattering layer such that a channeling tail of the dopant concentration profile occurs in the vertical direction.

21. The method according to claim 19, wherein the dopants of the implant step are selected to form implant regions of the same first conductivity type.

22. The method according to claim 19, wherein the gate dielectric layer is formed with a sequence of layers comprising a memory layer which is confined on its top and bottom side each by at least one confinement layer.

23. The method according to claim 22, wherein the memory layer is formed with a nitride.

24. The method according to claim 22, wherein the confinement layers are formed with an oxide.

25. The method according to claim 22, wherein the memory layer is provided to store at least two bits of information independently from each other by means of trapping hot charge carriers generated at a selected pn-junction of the source or drain regions, which has a strong gradient of charge carrier concentration.

26. The method according to claim 19, further comprising an implant step performed on the semiconductor substrate prior to forming the gate dielectric layer and the stack including the gate conductor in order to form the well region, which comprises dopants of a second conductivity type, which is different from the first conductivity type.

27. The method according to claim 19, wherein the dopants selected for the implant step comprise a dopant selected from the group consisting of Antimony (Sb), Phosphorous (P), and Arsenic (As).

28. A method of producing a semiconductor device, the method comprising:
providing a semiconductor substrate having a surface portion covered by a gate dielectric layer for trapping charges and a stack including a gate electrode formed on the gate dielectric layer;
performing a first implant step with dopants with respect to the semiconductor substrate adjacent to the surface portion covered by the gate dielectric layer, to form source and drain regions, which include a highly doped implant region that has a dopant concentration, a lateral and a vertical dimension;
forming spacers at sidewalls of the stack including the gate electrode in order to cover a surface portion of highly doped implant region; and
thereafter performing a second implant step with dopants with respect to the semiconductor substrate adjacent to the surface portion covered by the additional spacers, to form source and drain regions, which further include a lightly doped implant region, which has a dopant concentration and a lateral dimension smaller than that of the highly doped implant region, a vertical dimension larger than that of the highly doped implant region, such that a pn-junction with a strong gradient of dopant concentration extends laterally towards a depletion region of the transistor and a pn-junction with a weak gradient of dopant concentration extends vertically towards a well region.

29. The method according to claim 28, wherein the dopants of the first and second implant step are selected to form implant regions of the same first conductivity type.

30. The method according to claim 28, wherein the gate dielectric layer is formed with a sequence of layers comprising a memory layer which is confined on its top and bottom side each by at least one confinement layer.

31. The method according to claim 30, wherein the memory layer is formed with a nitride.

32. The method according to claim 31, wherein the confinement layers are each formed with an oxide.

33. The method according to claim 31, wherein the memory layer is provided to store at least two bits of information independently from each other by means of trapping hot charge carriers generated at a selected one of the pn-junctions of the source or drain regions, which has a strong gradient of charge carrier concentration.

34. The method according to claim 28, further comprising an implant step performed on the semiconductor substrate prior to forming the gate dielectric layer and the stack including the gate conductor in order to form the well region, which comprises dopants of a second conductivity type, which is different from the first conductivity type.

35. The method according to claim 28, wherein the dopants selected for the first implant step and the dopants selected for the second implant step comprise the same element selected from the group consisting of Antimony (Sb), Phosphorous (P), and Arsenic (As).

36. The method according to claim 28, wherein the dopants selected for the first implant step and the dopants selected for the second implant step comprise different elements that are selected from the group consisting of Antimony (Sb), Phosphorous (P), and Arsenic (As).

37. The method according to claim 34, wherein the step of forming the well region comprises forming a pocket implantation region adjacent to a respective pn-junction each of the source and drain regions, the pocket implantation zone comprising a concentration of dopants of the second conductivity type.

38. The method according to claim 37, wherein the dopants of the pocket implantation zone are selected to comprise boron.

39. Method of producing a semiconductor device, the method comprising
  providing a semiconductor substrate having a surface portion covered by a gate dielectric layer for trapping charges and a stack including a gate electrode formed on the gate dielectric layer;
  performing a first implant step with dopants with respect to the semiconductor substrate adjacent to the surface portion covered by the gate dielectric layer, to form source and drain regions, which include a highly doped implant region that has a dopant concentration, a lateral and a vertical dimension;
  applying a thermal diffusion process to increase the lateral dimension of the highly doped implant region;
  thereafter performing a second implant step with dopants with respect to the semiconductor substrate adjacent to the surface portion covered by the additional spacers, to form source and drain regions, which further include a lightly doped implant region, which has a dopant concentration and a lateral dimension smaller than that of the highly doped implant region, a vertical dimension larger than that of the highly doped implant region, such that a pn-junction with a strong gradient of dopant concentration extends laterally towards a depletion region of the transistor and a pn-junction with a weak gradient of dopant concentration extends vertically towards a well region.

40. The method according to claim 39, wherein the dopants of the first and second implant step are selected to form implant regions of the same first conductivity type.

41. The method according to claim 39, wherein the gate dielectric layer is formed with a sequence of layers comprising a memory layer which is confined on its top and bottom side each by at least one confinement layer.

42. The method according to claim 41, wherein the memory layer is formed with a nitride.

43. The method according to claim 42, wherein the confinement layers are each formed from an oxide.

44. The method according to claim 42, wherein the memory layer is provided to store at least two bits of information independently from each other by means of trapping hot charge carriers generated at a selected one of the pn-junctions of the source or drain regions, which has a strong gradient of charge carrier concentration.

45. The method according to claim 39, further comprising an implant step performed on the semiconductor substrate prior to forming the gate dielectric layer and the stack including the gate conductor in order to form the well region, which comprises dopants of a second conductivity type, which is different from the first conductivity type.

46. The method according to claim 39, wherein the dopants selected for the first implant step and the dopants selected for the second implant step comprise the same element, the element being selected from the group consisting of Antimony (Sb), Phosphorous (P), and Arsenic (As).

47. The method according to claim 39, wherein the dopants selected for the first implant step and the dopants selected for the second implant step comprise different elements that are selected from the group consisting of Antimony (Sb), Phosphorous (P), and Arsenic (As).

48. The method according to claim 44, wherein the step of forming the well region comprises forming a pocket implantation region adjacent to a respective pn-junction each of the source and drain regions, the pocket implantation zone comprising a concentration of dopants of the second conductivity type.

49. The method according to claim 48, wherein the dopants of the pocket implantation zone are selected to comprise boron.

* * * * *